(12) United States Patent
He et al.

(10) Patent No.: US 10,457,498 B2
(45) Date of Patent: Oct. 29, 2019

(54) TRANSFER DEVICE AND TRANSFER METHOD

(71) Applicant: BOE TECHNOLOGY GROUP CO., LTD., Beijing (CN)

(72) Inventors: Xiaolong He, Beijing (CN); Zhifu Li, Beijing (CN); Zhiyuan Ji, Beijing (CN); Jikai Yao, Beijing (CN); Feng Guan, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 153 days.

(21) Appl. No.: 15/673,242

(22) Filed: Aug. 9, 2017

(65) Prior Publication Data

US 2018/0047601 A1    Feb. 15, 2018

(30) Foreign Application Priority Data

Aug. 10, 2016  (CN) .......................... 2016 1 0653557

(51) Int. Cl.
| | |
|---|---|
| *B65G 47/84* | (2006.01) |
| *B65G 29/02* | (2006.01) |
| *B65G 45/22* | (2006.01) |
| *H01L 21/67* | (2006.01) |
| *H01L 21/677* | (2006.01) |
| *H01L 21/687* | (2006.01) |
| *B08B 3/02* | (2006.01) |

(52) U.S. Cl.
CPC ............ *B65G 47/846* (2013.01); *B08B 3/022* (2013.01); *B65G 29/02* (2013.01); *B65G 45/22* (2013.01); *H01L 21/67132* (2013.01); *H01L 21/67259* (2013.01); *H01L 21/67742* (2013.01); *H01L 21/67781* (2013.01); *H01L 21/68707* (2013.01)

(58) Field of Classification Search
CPC ........ B65G 29/00; B65G 29/02; B65G 45/22; B65G 47/57; B65G 47/846; B08B 3/022
See application file for complete search history.

(56) References Cited

U.S. PATENT DOCUMENTS

| | | | | |
|---|---|---|---|---|
| 7,721,872 | B2 * | 5/2010 | Aoyama | ........... A61F 13/15764 198/474.1 |
| 9,281,230 | B2 * | 3/2016 | Kim | .................... H01L 21/6836 |
| 2007/0227858 | A1 * | 10/2007 | Aoyama | ........... A61F 13/15764 198/612 |
| 2018/0061687 | A1 * | 3/2018 | He | ........................ B08B 7/0028 |

* cited by examiner

*Primary Examiner* — Gene O Crawford
*Assistant Examiner* — Keith R Campbell
(74) *Attorney, Agent, or Firm* — Nath, Goldberg & Meyer; Joshua B. Goldberg; Tanya E. Harkins

(57) ABSTRACT

A transfer device and a transfer method using the same. The transfer device comprises a first conveyance roller, a transfer roller and a second conveyance roller. The transfer roller includes a roller body and stamp contacts formed on and protruded from the roller body. The stamp contacts can absorb elements, axes of the first conveyance roller. The transfer roller and the second conveyance roller are arranged in parallel with each other. The transfer roller is interposed between the first and second conveyance rollers. A first roll gap is formed between the first conveyance roller and the transfer roller to convey a medium substrate, and a second roll gap is formed between the second conveyance roller and the transfer roller to convey a target substrate. The transfer device and method can be used to transfer a great amount of elements to the substrate having large size.

18 Claims, 2 Drawing Sheets

TRANSFER DEVICE AND TRANSFER METHOD

CROSS-REFERENCE TO RELATED APPLICATION

This application claims the priority of Chinese Patent Application No. 201610653557.4 filed on Aug. 10, 2016, titled "TRANSFER DEVICE AND TRANSFER METHOD" in the Chinese Intellectual Property Office, the entire content of which is incorporated herein by reference.

FIELD OF THE INVENTION

The embodiments of the disclosure relate to the field of micro-electronics processing equipment, and particularly to a transfer device and a transfer method using the same.

BACKGROUND OF THE INVENTION

In the processing of micro-electronic equipment, transfer technologies sometimes may be employed. For example, micro-components can be first grown and formed on a silicon wafer and then transferred to a substrate using a stamp.

However, this transfer method has a lower efficiency and cannot be used to transfer elements onto a substrate having a large size.

SUMMARY OF THE INVENTION

Objectives of the disclosure are to provide a transfer device and a transfer method using the same at least to address one of above problems.

To achieve above objectives, as one aspect of the disclosure, there is provided a transfer device. The transfer device comprises a first conveyance roller, a transfer roller and a second conveyance roller. The transfer roller includes a roller body and a plurality of first stamp contacts formed on and protruded from a peripheral surface of the roller body, the first stamp contacts are able to absorb elements to be transferred, an axis of the first conveyance roller, an axis of the transfer roller and an axis of the second conveyance roller are arranged in parallel with each other, the transfer roller is interposed between the first conveyance roller and the second conveyance roller, and a first roll gap is formed between the first conveyance roller and the transfer roller to convey a medium substrate, and a second roll gap is formed between the second conveyance roller and the transfer roller to convey a target substrate.

Preferably, the first stamp contacts are made of dimethyl silicone polymer.

Preferably, the transfer device further comprises a panel stamp including a panel base and second stamp contacts formed on a surface of the panel base, the second stamp contacts are able to absorb the elements to be transferred, and an interval between adjacent two second stamp contacts is equivalent to an interval between adjacent two first stamp contacts, or an interval between adjacent two second stamp contacts is an integral multiple of an interval between adjacent two first stamp contacts.

Preferably, the second stamp contacts are made of dimethyl silicone polymer.

Preferably, the transfer device comprises the medium substrate.

Preferably, the transfer device comprises a station and a mounting rack fixed on the station, the mounting rack comprises a support rod, a first mounting rod, a second mounting rod and a third mounting rod, wherein one end of the support rod is fixed to the station, and the first mounting rod, the second mounting rod and the third mounting rod are arranged along a height direction of the support rod and perpendicularly to the support rod, and the first conveyance roller, the transfer roller and the second conveyance roller are mounted on the first mounting rod, the second mounting rod and the third mounting rod, respectively.

Preferably, the transfer device further comprises a cleaning mechanism configured to clean the transfer roller.

Preferably, the cleaning mechanism comprises a fourth mounting rod and a cleaning unit, the fourth mounting rod is fixed to the station at one end therefore, and is provided with the cleaning unit at the other end thereof, and the cleaning unit is able to spray cleaning fluid onto the transfer roller.

Preferably, the transfer device further comprises a driving mechanism configured to rotate the first conveyance roller, the transfer roller and the second conveyance roller.

Preferably, the transfer device further comprises a plurality of medium substrate support rollers configured to support the medium substrate, axes of the medium substrate support rollers are in parallel with the axis of the first conveyance roller, the medium substrate support rollers are arranged on both sides of the first conveyance roller with respect to a width direction thereof, and a space between a support surface of the medium substrate support rollers and a conveyance surface of the first conveyance roller is equivalent to a thickness of the medium substrate.

Preferably, the transfer device further comprises a plurality of target substrate support rollers configured to support the target substrate, axes of the target substrate support rollers 3000 are in parallel with the axis of the second conveyance roller, the target substrate support rollers are arranged on both sides of the second conveyance roller with respect to a width direction thereof, and a support surface of the target substrate support rollers is flush with the conveyance surface of the first conveyance roller.

As another aspect of the disclosure, there is provided a transfer method using above transfer device according to the disclosure. The transfer method comprises steps of:

absorbing elements to be transferred onto a surface on one side of a medium substrate;

interposing the medium substrate on which the elements are disposed between a first conveyance roller and a transfer roller, such that the elements face to first stamp contacts of the transfer roller;

interposing a target substrate between a second conveyance roller and the transfer roller; and driving the first conveyance roller and the second conveyance roller to rotate in one direction, while driving the transfer roller to rotate in a direction opposite to the rotation of the first conveyance roller and the second conveyance roller.

In the transfer process, the first conveyance roller and the second conveyance roller are driven to be rotated in one direction, while the transfer roller is rotated in a direction opposite to the rotation of the first conveyance roller 100 and the second conveyance roller 300. The first stamp contacts 220 can absorb the elements 400 on the medium substrate 500 to the transfer roller 200, and with the rotation of the transfer roller 200, the elements absorbed on the first stamp contact 220 are transferred to the target substrate 600.

BRIEF DESCRIPTION OF THE DRAWINGS

Accompanying drawings are provided for further understanding of this disclosure and constitute a part of the specification. Hereinafter, these drawings are intended to explain the disclosure together along with the following specific embodiments, but should not be considered as a limitation of the disclosure. In which.

Figure 1:
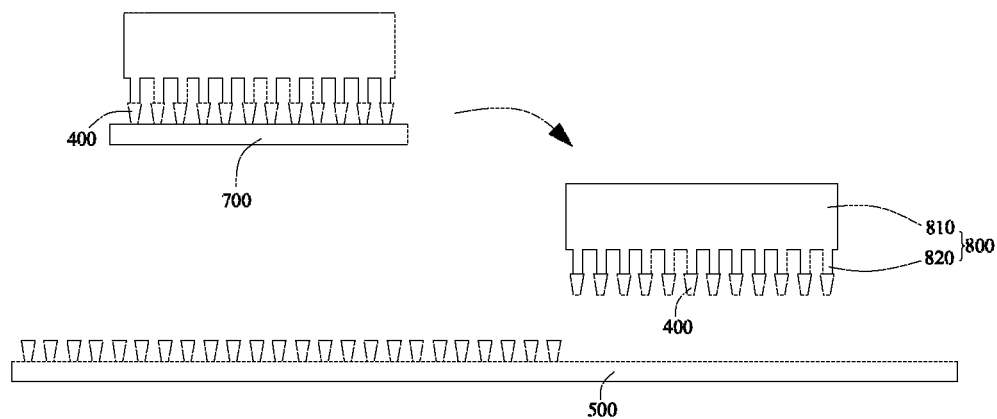
FIG. 1 is a schematic diagram showing a process in which elements grown on a silicon wafer are being transferred onto a medium substrate.

| Reference Numeral List | |
|---|---|
| 100: first conveyance roller | 200: transfer roller |
| 210: roller body | 220: first stamp contact |
| 300: second conveyance roller | 400: elements to be transferred |
| 500: medium substrate | 600: target substrate |
| 700: substrate | 800: panel stamp |
| 810: panel base | 820: second stamp contact |
| 910: station | 920: mounting rack |
| 921: support rod | 922: first mounting rod |
| 923: second mounting rod | 924: third mounting rod |
| 1000: cleaning mechanism | 1100: fourth mounting rod |
| 1200: cleaning unit | 2000: medium substrate support roller |
| 3000: target substrate support roller | |

DETAILED DESCRIPTION OF THE EMBODIMENTS

The specific embodiments of the disclosure will be further described in detail in conjunction with the accompanying drawings. It should be understood that the specific embodiments described herein are provided for the purpose of explanation and illustration of the disclosure but not intended to limit the disclosure.

Figure 2:
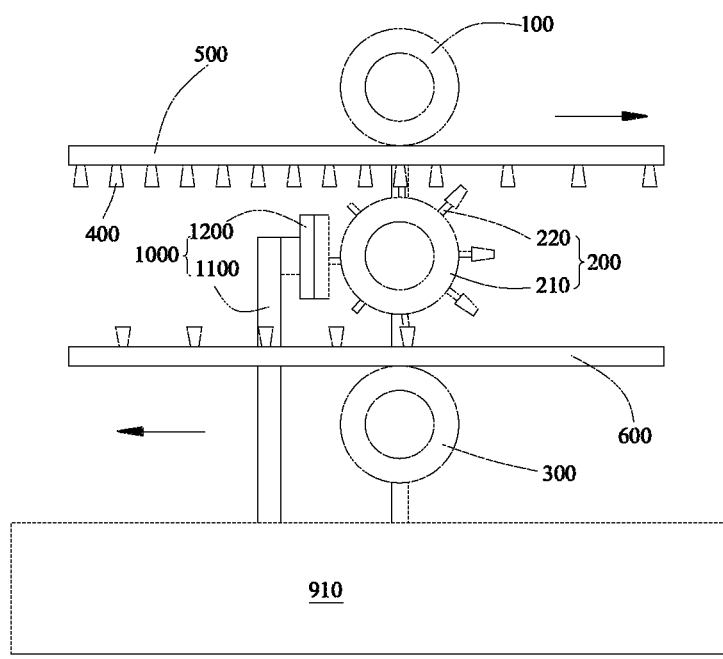
FIG. 2 is a schematic front view of the transfer device according to the disclosure.

As one aspect of the disclosure, there is provided a transfer device. As shown in FIG. 2, the transfer device includes a first conveyance roller 100, a transfer roller 200 and a second conveyance roller 300, wherein the transfer roller 200 includes a roller body 210 and a plurality of first stamp contacts 220 formed on and protruded from a peripheral surface of the roller body 210, the first stamp contact 220 being able to absorb elements to be transferred 400. An axis of the first conveyance roller 100, an axis of the transfer roller 200 and an axis of the second conveyance roller 300 are arranged in parallel with each other. The transfer roller 200 is interposed between the first conveyance roller 100 and the second conveyance roller 300. A first roll gap is formed between the first conveyance roller 100 and the transfer roller 200 to convey a medium substrate 500, and a second roll gap is formed between the second conveyance roller 300 and the transfer roller 200 to convey a target substrate 600.

Before the elements to be transferred 400 are transferred to the target substrate 600 by using the transfer device provided in the embodiments of the disclosure, the elements 400 are first disposed on the medium substrate 500 at a predefined interval. Subsequently, the medium substrate 500 on which the elements 400 are disposed is interposed between the first conveyance roller 100 and the transfer roller 200, such that the elements 400 face to the transfer roller 200. At this point, the target substrate 600 is interposed between the second conveyance roller 300 and the transfer roller 200.

In the transfer process, the first conveyance roller 100 and the second conveyance roller 300 are driven to be rotated in one direction, while the transfer roller 200 is rotated in a direction opposite to the rotation of the first conveyance roller 100 and the second conveyance roller 300. The first stamp contacts 220 can absorb the elements 400 on the medium substrate 500 to the transfer roller 200, and with the rotation of the transfer roller 200, the elements absorbed on the first stamp contact 220 are transferred to the target substrate 600.

In the embodiment as shown in FIG. 2, the first conveyance roller 100 rotates along a counter-clockwise direction, while the transfer roller 200 rotates along a clockwise direction, such that the medium substrate 500 moves to a right side in the figure. At this point, the second conveyance roller 300 rotates along the counter-clockwise direction, such that the target substrate 600 moves to a left side in the figure.

In the transfer process, a great amount of elements 400 can be disposed on the medium substrate once, such that these elements can be transferred to the target substrate 600 having a large size.

In this embodiment of the disclosure, there is no special restriction on materials of the first stamp contact 220. Normally, the elements to be transferred 400 are silicon elements grown on the silicon wafer. Therefore, when the first stamp contacts 220 are made of dimethyl silicone polymer, the elements 400 can be advantageously absorbed.

In this embodiment of the disclosure, there is no special restriction on how the elements to be transferred 400 are transferred from a substrate 700 on which the elements 400 are grown to the medium substrate 500. As shown in FIG. 1, a panel stamp can be used to transfer the elements 400 on the substrate 700 to the medium substrate. As shown in FIG. 1, the transfer device further comprises a panel stamp 800 including a panel base 810 and second stamp contacts 820 formed on a surface of the panel base 810, the second stamp contacts 820 are able to absorb the elements to be transferred 400, and an interval between adjacent two second stamp contacts 820 is equivalent to an interval between adjacent two first stamp contacts 220, or an interval between adjacent two second stamp contacts 820 is an integral multiple of an interval between adjacent two first stamp contacts 220.

As could be seen from FIG. 1, a space between the elements 400 transferred on the medium substrate 500 is equivalent to a space between the elements 400 on the substrate 700, which is indicated by d.

In the implementation as shown in FIG. 2, an arc length between tips of adjacent two first stamp contacts 220 is 2d. Therefore, an interval between the elements 400 transferred on the target substrate 600 is 2d.

After a preliminary transfer, a certain amount of the elements 400 still remain on the medium substrate 500. At this time, the remainder elements 400 can be transferred to the target substrate 600.

As stated above, the elements 400 can be silicon elements. In order to facilitate the absorption of the elements 400, preferably, the second stamp contacts 820 are also made of the dimethyl silicone polymer.

In this embodiment of the disclosure, the medium substrate 500 may be provided by a user. As an alternative, the transfer device can preferably comprise the medium substrate 500. In the case where the transfer device comprises the medium substrate 500, there is no need for the user to prepare the medium substrate 500. In this embodiment of the disclosure, the medium substrate 500 can be made of glass, silicon wafer, flexible resin substrate (for example, polyimide substrate, polystyrene substrate, epoxy resin substrate, etc.).

Figure 3:
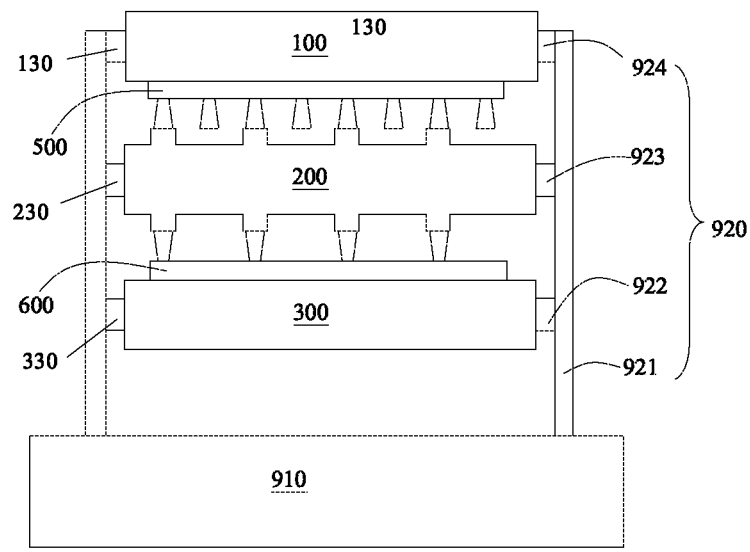
FIG. 3 is a schematic side view of the transfer device according to the disclosure.

In this embodiment of the disclosure, it is necessary to fix the first conveyance roller 100, the transfer roller 200 and the second conveyance roller 300 at stationary positions. Accordingly, as shown in FIG. 3, the transfer device comprises a station 910 and a mounting rack 920 fixed on the station 910. The mounting rack 920 comprises a support rod 921, a first mounting rod 922, a second mounting rod 923 and a third mounting rod 924, wherein one end of the support rod 921 is fixed to the station 910, and the first mounting rod 922, the second mounting rod 923 and the third mounting rod 924 are arranged along a height direction of the support rod 921 and perpendicularly to the support rod 921. As shown in FIG. 3, the first conveyance roller 100, the transfer roller 200 and the second conveyance roller 300 are mounted on the first mounting rod 922, the second mounting rod 923 and the third mounting rod 924, respectively.

The station 910 and the mounting rack 920 can be provided to more stably support the first conveyance roller 100, the transfer roller 200 and the second conveyance roller 300, thereby ensuring an accuracy of transfer.

Preferably, as shown in FIG. 2, the transfer device further comprises a cleaning mechanism 1000 configured to clean the transfer roller 200.

The cleaning mechanism 1000 is able to spray cleaning fluid onto the transfer roller 200. In the implementation as shown in FIG. 2, the cleaning mechanism 1000 is provided on the station 910.

In the implementation as shown in FIG. 2, the cleaning mechanism 1000 comprises a fourth mounting rod 1100 and a cleaning unit 1200. The fourth mounting rod 1100 is fixed to the station 910 at one end therefore, and is provided with the cleaning unit 1200 at the other end thereof. The cleaning unit 1200 is able to spray cleaning fluid onto the transfer roller 200.

In order to complete the transfer, preferably, the transfer device further comprises a driving mechanism (which is indicated as reference numerals "130", "230" and "330" in FIG. 3) configured to rotate the first conveyance roller, the transfer roller and the second conveyance roller.

Figure 4:
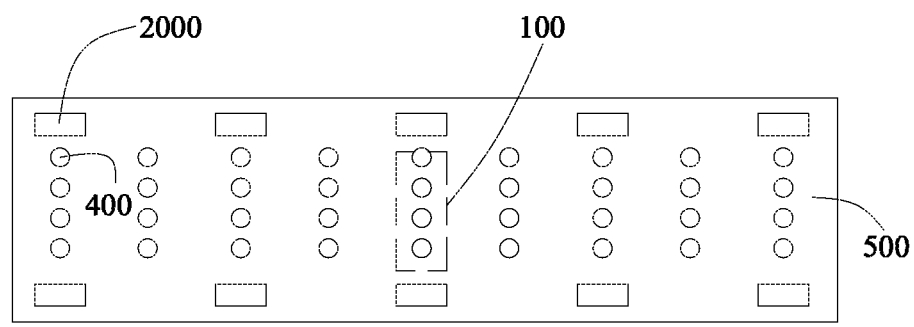
FIG. 4 is a schematic bottom view of a portion of the transfer device according to the disclosure, showing a first conveyance roller and medium substrate support rollers.

Throughout the transfer process, the medium substrate 500 is necessarily kept in a stable condition. Preferably, as shown in FIG. 4, the transfer device further comprises a plurality of medium substrate support rollers 2000 configured to support the medium substrate 500. Axes of the medium substrate support rollers 2000 are in parallel with the axis of the first conveyance roller 100. The medium substrate support rollers 2000 are arranged on both sides of the first conveyance roller 100 with respect to a width direction thereof (for example, up and down direction in FIG. 4). It should be understood that in the transfer process, margins are left on both sides of the medium substrate 500 to support the medium substrate support roller 2000. A space between a support surface of the medium substrate support rollers 2000 and a conveyance surface of the first conveyance roller 100 is equivalent to a thickness of the medium substrate 500.

Figure 5:
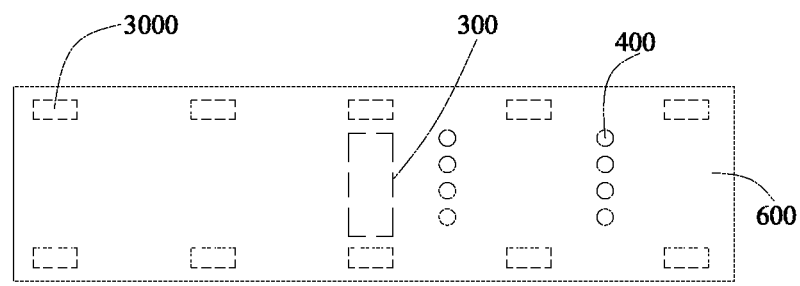
FIG. 5 is a schematic top plan view of a portion of the transfer device according to the disclosure, showing a second conveyance roller and target substrate support rollers.

Throughout the transfer process, the target substrate 600 is necessarily kept in a stable condition. Preferably, as shown in FIG. 5, the transfer device further comprises a plurality of target substrate support rollers 3000 configured to support the target substrate 600. Axes of the target substrate support rollers 3000 are in parallel with the axis of the second conveyance roller 300. The target substrate support rollers 3000 are arranged on both sides of the second conveyance roller 300 with respect to a width direction thereof. A support surface of the target substrate support rollers 3000 is flush with the conveyance surface of the first conveyance roller 100.

As another aspect of the disclosure, there is provided a transfer method using the transfer device according to the disclosure. The transfer method comprises steps of:

absorbing elements to be transferred 400 onto a surface on one side of a medium substrate 500 (as shown in FIG. 1);

interposing the medium substrate 500 on which the elements 400 are disposed between a first conveyance roller 100 and a transfer roller 200, such that the elements 400 face to first stamp contacts 220 of the transfer roller 200;

interposing a target substrate 600 between a second conveyance roller 300 and the transfer roller 200; and driving the first conveyance roller 100 and the second conveyance roller 300 to rotate in one direction, while driving the transfer roller 200 to rotate in a direction opposite to the rotation of the first conveyance roller 100 and the second conveyance roller 300.

In this embodiment of the disclosure, a panel stamp 800 can be used to transfer the elements to be transferred 400 from a substrate 700 to the medium substrate 500.

As stated above, in the transfer process, the first conveyance roller 100 and the second conveyance roller 300 are driven to be rotated in one direction, while the transfer roller 200 is rotated in a direction opposite to the rotation of the first conveyance roller 100 and the second conveyance roller 300. The first stamp contacts 220 can absorb the elements 400 on the medium substrate 500 to the transfer roller 200, and with the rotation of the transfer roller 200, the elements absorbed on the first stamp contact 220 are transferred to the target substrate 600.

In the embodiment as shown in FIG. 2, the first conveyance roller 100 rotates along a counter-clockwise direction, while the transfer roller 200 rotates along a clockwise direction, such that the medium substrate 500 moves to a right side in the figure. At this point, the second conveyance roller 300 rotates along the counter-clockwise direction, such that the target substrate 600 moves to a left side in the figure.

In the transfer process, a great amount of elements 400 can be disposed on the medium substrate once, such that these elements can be transferred to the target substrate 600 having a large size.

It should be understood that the above implementations are merely exemplary embodiments for the purpose of illustrating the principle of the disclosure, and the disclosure is not limited thereto. Various modifications and improvements can be made by a person having ordinary skill in the art without departing from the spirit and essence of the disclosure. Accordingly, all of the modifications and improvements also fall into the protection scope of the disclosure.

The invention claimed is:

1. A transfer device, comprising a first conveyance roller, a transfer roller and a second conveyance roller, wherein
    the transfer roller includes a roller body and a plurality of first stamp contacts formed on and protruded from a peripheral surface of the roller body,
    the first stamp contacts are able to absorb elements to be transferred, an axis of the first conveyance roller, an axis of the transfer roller and an axis of the second conveyance roller are arranged in parallel with each other, the transfer roller is interposed between the first conveyance roller and the second conveyance roller, a first roll gap is formed between the first conveyance roller and the transfer roller to convey a medium substrate, and a second roll gap is formed between the second conveyance roller and the transfer roller to convey a target substrate, and the transfer device further includes a driving mechanism configured to rotate the first conveyance roller, the transfer roller and the second conveyance roller.

2. The transfer device according to claim 1, wherein the first stamp contacts are made of dimethyl silicone polymer.

3. The transfer device according to claim 1, wherein the transfer device further comprises a panel stamp including a panel base and second stamp contacts formed on a surface of the panel base, the second stamp contacts are able to absorb the elements to be transferred, and an interval between adjacent two second stamp contacts is equivalent to an interval between adjacent two first stamp contacts, or an interval between adjacent two second stamp contacts is an integral multiple of an interval between adjacent two first stamp contacts.

4. The transfer device according to claim 3, wherein the second stamp contacts are made of dimethyl silicone polymer.

5. The transfer device according to claim 1, wherein the transfer device comprises the medium substrate.

6. The transfer device according to claim 1, wherein the transfer device comprises a station and a mounting rack fixed on the station, the mounting rack comprises a support rod, a first mounting rod, a second mounting rod and a third mounting rod, wherein one end of the support rod is fixed to the station, and the first mounting rod, the second mounting rod and the third mounting rod are arranged along a height direction of the support rod and perpendicularly to the support rod, and the first conveyance roller, the transfer roller and the second conveyance roller are mounted on the first mounting rod, the second mounting rod and the third mounting rod, respectively.

7. The transfer device according to claim 6, wherein the transfer device further comprises a cleaning mechanism configured to clean the transfer roller.

8. The transfer device according to claim 7, wherein the cleaning mechanism comprises a fourth mounting rod and a cleaning unit, the fourth mounting rod is fixed to the station at one end therefore, and is provided with the cleaning unit at the other end thereof, and the cleaning unit is able to spray cleaning fluid onto the transfer roller.

9. The transfer device according to claim 1, wherein the transfer device further comprises a plurality of medium substrate support rollers configured to support the medium substrate, axes of the medium substrate support rollers are in parallel with the axis of the first conveyance roller, the medium substrate support rollers are arranged on both sides of the first conveyance roller with respect to a width direction thereof, and a space between a support surface of the medium substrate support rollers and a conveyance surface of the first conveyance roller is equivalent to a thickness of the medium substrate.

10. The transfer device according to claim 1, wherein the transfer device further comprises a plurality of target substrate support rollers configured to support the target substrate, axes of the target substrate support rollers are in parallel with the axis of the second conveyance roller, the target substrate support rollers are arranged on both sides of the second conveyance roller with respect to a width direction thereof, and a support surface of the target substrate support rollers is flush with the conveyance surface of the first conveyance roller.

11. A transfer method, comprises steps of:

providing a transfer device comprising a first conveyance roller, a transfer roller and a second conveyance roller, wherein the transfer roller includes a roller body and a plurality of first stamp contacts formed on and protruded from a peripheral surface of the roller body, the first stamp contacts are able to absorb elements to be transferred, an axis of the first conveyance roller, an axis of the transfer roller and an axis of the second conveyance roller are arranged in parallel with each other, the transfer roller is interposed between the first conveyance roller and the second conveyance roller, a first roll gap is formed between the first conveyance roller and the transfer roller to convey a medium substrate, a second roll gap is formed between the second conveyance roller and the transfer roller to convey a target substrate and the transfer device further includes a driving mechanism configured to rotate the first conveyance roller, the transfer roller and the second conveyance roller;

absorbing elements to be transferred onto a surface on one side of the medium substrate;

interposing the medium substrate on which the elements are disposed between the first conveyance roller and the transfer roller, such that the elements face to the first stamp contacts of the transfer roller;

interposing the target substrate between the second conveyance roller and the transfer roller; and driving the first conveyance roller and the second conveyance roller to rotate in one direction, while driving the transfer roller to rotate in a direction opposite to the rotation of the first conveyance roller and the second conveyance roller.

12. The transfer method according the claim 11, wherein the transfer device further comprises a panel stamp including a panel base and second stamp contacts formed on a surface of the panel base, the second stamp contacts are able to absorb the elements to be transferred, and an interval between adjacent two second stamp contacts is equivalent to an interval between adjacent two first stamp contacts, or an interval between adjacent two second stamp contacts is an integral multiple of an interval between adjacent two first stamp contacts.

13. The transfer method according the claim 11, wherein the transfer device comprises a station and a mounting rack fixed on the station, the mounting rack comprises a support rod, a first mounting rod, a second mounting rod and a third mounting rod, wherein one end of the support rod is fixed to the station, and the first mounting rod, the second mounting rod and the third mounting rod are arranged along a height direction of the support rod and perpendicularly to the support rod, and the first conveyance roller, the transfer roller and the second conveyance roller are mounted on the first mounting rod, the second mounting rod and the third mounting rod, respectively.

14. The transfer method according the claim 13, wherein the transfer device further comprises a cleaning mechanism configured to clean the transfer roller.

15. The transfer method according the claim 14, wherein the cleaning mechanism comprises a fourth mounting rod and a cleaning unit, the fourth mounting rod is fixed to the station at one end therefore, and is provided with the cleaning unit at the other end thereof, and the cleaning unit is able to spray cleaning fluid onto the transfer roller.

16. The transfer method according the claim 11, wherein the transfer device further comprises a plurality of medium substrate support rollers configured to support the medium substrate, axes of the medium substrate support rollers are in parallel with the axis of the first conveyance roller, the medium substrate support rollers are arranged on both sides of the first conveyance roller with respect to a width direction thereof, and a space between a support surface of the medium substrate support rollers and a conveyance surface of the first conveyance roller is equivalent to a thickness of the medium substrate.

17. The transfer method according the claim 11, wherein the transfer device further comprises a plurality of target substrate support rollers configured to support the target substrate, axes of the target substrate support rollers are in parallel with the axis of the second conveyance roller, the target substrate support rollers are arranged on both sides of the second conveyance roller with respect to a width direction thereof, and a support surface of the target substrate support rollers is flush with the conveyance surface of the first conveyance roller.

18. The transfer method according the claim 11, wherein the first stamp contacts are made of dimethyl silicone polymer.

* * * * *